(12) United States Patent
Liu et al.

(10) Patent No.: US 6,756,235 B1
(45) Date of Patent: Jun. 29, 2004

(54) METAL OXIDE FILM FORMATION METHOD AND APPARATUS

(75) Inventors: Yijun Liu, College Park, MD (US); Hiroshi Shinriki, Yamanashi (JP); Takashi Magara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 55 days.

(21) Appl. No.: 09/641,681

(22) Filed: Aug. 18, 2000

(30) Foreign Application Priority Data

Aug. 20, 1999 (JP) .......................................... 11-234209

(51) Int. Cl.$^7$ ............................................. H01L 21/00
(52) U.S. Cl. ........................ 438/3; 438/785; 118/719; 118/725; 427/255; 427/126.3
(58) Field of Search ........................... 438/3, 785, 681; 427/255, 255.1, 255.2, 255.3, 248.1, 109, 126.3; 118/719, 715, 730, 725

(56) References Cited

U.S. PATENT DOCUMENTS

| | | | |
|---|---|---|---|
| 4,514,441 A | | 4/1985 | Alexander |
| 4,951,603 A | | 8/1990 | Yoshino et al. |
| 5,155,658 A | | 10/1992 | Inam et al. |
| 5,478,610 A | | 12/1995 | Desu et al. |
| 5,500,988 A | | 3/1996 | Moynihan et al. |
| 5,536,323 A | | 7/1996 | Kirlin et al. |
| 5,555,154 A | | 9/1996 | Uchikawa et al. |
| 5,595,606 A | | 1/1997 | Fujikawa et al. |
| 5,641,540 A | | 6/1997 | Lee et al. |
| 5,653,806 A | * | 8/1997 | Van Buskirk ............... 118/715 |
| 5,766,364 A | * | 6/1998 | Ishida et al. ................ 118/725 |
| 5,817,170 A | | 10/1998 | Desu et al. |
| 5,876,503 A | | 3/1999 | Roeder et al. |
| 6,039,465 A | | 3/2000 | Hirabayashi et al. |
| 6,051,286 A | | 4/2000 | Zhao et al. |
| 6,066,204 A | * | 5/2000 | Haven ......................... 117/89 |
| 6,074,487 A | | 6/2000 | Yoshioka et al. |
| 6,077,715 A | * | 6/2000 | Chivukula et al. ............. 438/3 |
| 6,090,210 A | * | 7/2000 | Ballance et al. ............ 118/725 |
| 6,106,625 A | * | 8/2000 | Koai et al. ................... 118/715 |
| 6,126,753 A | | 10/2000 | Shinriki et al. |
| 6,161,500 A | * | 12/2000 | Kopacz et al. ........... 118/723 E |
| 6,176,929 B1 | | 1/2001 | Fukunaga et al. |
| 6,179,920 B1 | * | 1/2001 | Tarutani et al. ............. 118/715 |
| 6,190,728 B1 | | 2/2001 | Suzuki et al. |
| 6,204,204 B1 | * | 3/2001 | Paranjpe et al. ............. 438/785 |

(List continued on next page.)

FOREIGN PATENT DOCUMENTS

| | | | | |
|---|---|---|---|---|
| JP | 06-275546 | 9/1994 | | |
| JP | 06-275548 | 9/1994 | | |
| JP | 07-150359 | 6/1995 | | |
| JP | 2847981 | 11/1998 | | |
| JP | 2000-58525 | 2/2000 | | |
| JP | 2001023905 A | * | 1/2001 | ......... H01L/21/205 |
| KR | 920010426 B1 | 11/1992 | | |
| KR | 1998-60528 | 10/1998 | | |
| KR | 1998-60530 | 10/1998 | | |

OTHER PUBLICATIONS

U.S. patent application Ser. No. 09/657,627, filed Sep. 8, 2000.

U.S. patent application Ser. No. 09/658,507, filed Sep. 8, 2000.

*Primary Examiner*—Caridad Everhart
(74) *Attorney, Agent, or Firm*—Finnegan, Henderson, Farabow, Garrett & Dunner, LLP (57) ABSTRACT

In a metal oxide film formation method, a source gas mixture of organic compound gases containing at least three metals, and an oxidation gas are individually prepared. While the substrate is heated, the oxidation gas is supplied to a substrate set in a closed vessel at a predetermined pressure, and then the gas mixture is supplied. A metal oxide film is formed on the substrate. A metal oxide film formation apparatus is also disclosed.

25 Claims, 6 Drawing Sheets

U.S. PATENT DOCUMENTS 6,258,157 B1 * 7/2001 Gordon ................. 106/287.24
6,281,022 B1 * 8/2001 Li et al. ........................ 438/3
6,312,816 B1   11/2001 Roeder et al.
6,325,017 B1 * 12/2001 DeBoer et al. ......... 118/723 R
6,419,994 B1 * 7/2002 Marsh ........................ 427/534
6,428,850 B1   8/2002 Shinriki et al.
6,470,144 B1 * 10/2002 Tarutani et al. ............. 392/396
2002/0166507 A1   11/2002 Shinriki et al.

* cited by examiner

F I G. 7
PRIOR ART

METAL OXIDE FILM FORMATION METHOD AND APPARATUS

BACKGROUND OF THE INVENTION

The present invention relates to a metal oxide film formation method and apparatus for forming a metal oxide film made of $(Ba,Sr)TiO_3$ (barium strontium titanate; to be referred to as BST hereinafter) or $Pb(Zr,Ti)O_3$ (to be referred to as PZT hereinafter) having high permittivity used for a semiconductor memory device.

Along with rapid development of the semiconductor integration technique, various components forming a semiconductor integrated device are being downsized, increased in speed, and integrated at high degrees. For example, in the field of semiconductor memory devices, demands arise for larger capacity in addition to the above requirements.

For example, in a DRAM (Dynamic Random Access Memory) as a representative of semiconductor memory devices, a capacitor as one of main building components must be downsized and increased in capacitance per unit area.

A dielectric often used as the capacitor film of a DRAM capacitor is generally a silicon oxide in terms of the semiconductor process. The silicon oxide has a permittivity of 10 or less and a capacitance of 4 $fF/\mu m^2$ per unit area. The silicon oxide used for a capacitor formation film cannot obtain large capacitance per unit area.

Recently, BST and PZT having higher permittivity than that of the silicon oxide receive a great deal of attention as the materials of the capacitor formation film so as to increase the capacitance of the capacitor per unit area.

The DRAM structure will be described briefly.

Figure 7:
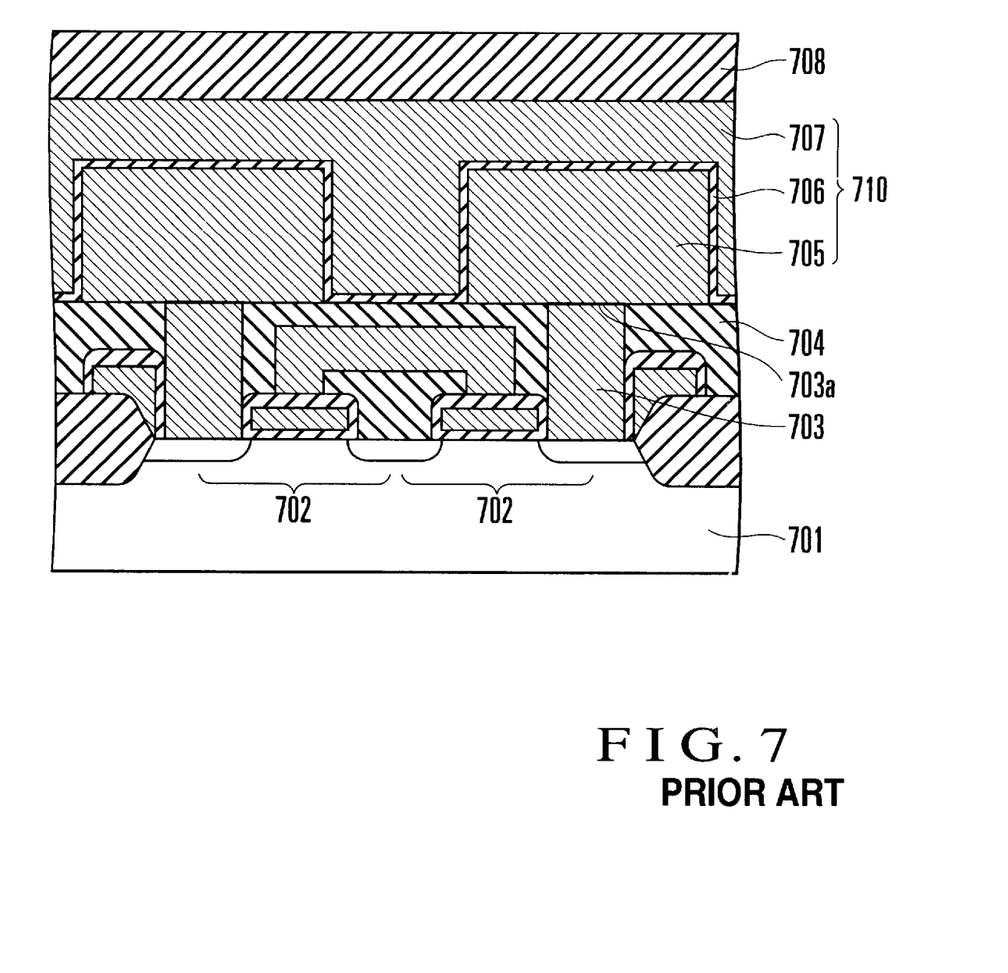
FIG. 7 is a sectional view showing part of a DRAM memory cell.

FIG. 7 shows part of a DRAM memory cell formed on an Si substrate 701. This DRAM memory cell is constituted by a transistor 702 and capacitor 710. The transistor 702 forming the memory cell is connected to the capacitor 710 via a plug 703 connected to a drain terminal. The plug 703 is formed in a contact hole formed in an interlevel insulating film 704 made of an insulator such as silicon oxide, and is made of polysilicon to which an impurity is doped to make the plug 703 conductive.

The plug 703 is connected to a storage node 705 serving as one of the electrodes of the capacitor 710. The storage node 705 connected to the plug 703 is formed on the flat interlevel insulating film 704, and is formed from a film of platinum, ruthenium oxide, or the like. The storage node 705 is connected to the plug 703 via a barrier film 703a of TiN or the like.

A cell plate 707 is formed on the interlevel insulating film 704 including the storage node 705 via a capacitor film 706. The storage node 705, capacitor film 706, and cell plate 707 constitute the capacitor 710. An upper interlevel insulating film 708 is formed on the capacitor 710. Although not shown, a word line and bit line respectively connected to the gate and source terminal of the transistor 702 are formed on the upper interlevel insulating film 708.

As described above, the dielectric capacitor film is formed on the DRAM memory cell so as to cover the storage node serving as one of the electrodes constituting the capacitor.

The first performance demanded for the capacitor film of the capacitor is high permittivity. Examples of the material having high permittivity are compounds containing Ba, Sr, Ti, Pb, Zn, Bi, and Ta as constituent elements. The second performance demanded for the capacitor film of the capacitor is small leakage current.

To manufacture a DRAM of 1 Gbits or more with high integration degree, not only a capacitor film is formed from a material of high permittivity, but also the capacitor is three-dimensionally formed to increase the capacitor area. To three-dimensionally form the capacitor, the storage node must be three-dimensionally formed to form a capacitor film uniform in film thickness, composition, and characteristics on not only the flat portion but also side wall of the storage node having the three-dimensional structure. Forming a uniform film (capacitor film) on both the flat portion and side wall of the three-dimensional structure requires a thin film formation method excellent in coverage on a complicated step shape.

An example of the thin film formation method excellent in step coverage is chemical vapor deposition (CVD). According to CVD, a compound material containing an element for forming a thin film must be carried as gas to a substrate on which the thin film is to be formed. The most preferable state of the CVD compound material is gas at room temperature. With the use of a CVD compound material which is gas at room temperature, the supply amount of compound material to a substrate on which a thin film is to be formed is determined by only the flow rate of the compound material gas, and thus supply of the compound material can be controlled with high precision. However, Ba, Sr, Ti, Pb, Zn, Bi, and Ta compounds forming high dielectrics or ferroelectrics cannot exist as gas at room temperature. These compounds are liquids or solids at room temperature.

Hence, in forming a material of high permittivity by CVD, a raw material is supplied by bubbling. Strictly speaking, a solid raw material is supplied by sublimation.

If a raw material is supplied by bubbling, the supply amount can be more stably controlled and easily increased. For this reason, a liquid raw material is more desirable than a solid raw material. Supply of a raw material by bubbling requires high vapor pressure such as a sufficiently high vapor pressure at room temperature or less if possible, and a large temperature difference between the evaporation temperature and the thermal decomposition temperature.

However, Ba, Sr, Ti, Pb, Zn, Bi, and Ta compounds hardly exhibit sufficiently high vapor pressure, and only generate vapor upon heating to some extent. Most of these compounds are organic metal compounds.

In terms of the presence of a liquid organic metal compound usable for CVD, BST as a solid solution of barium titanate ($BaTiO_3$: BT) and strontium titanate ($SrTiO_3$: ST) receives a great deal of attention as the above-mentioned DRAM capacitor film which can be formed by CVD.

The BST is a high-dielectric having a permittivity of 200 or more, and satisfies the first performance demanded for the DRAM capacitor film.

Barium, strontium, and titanium forming BST produce organic compounds, and a BST thin film can be formed by MOCVD (Metal Organic CVD). The thin film formation method using CVD is thermal CVD of forming a metal or compound film at a relatively low temperature (400 to 500° C.) using as a raw material an organic metal compound (MO) which is thermally unstable and readily decomposes.

The BST thin film can be formed by CVD capable of attaining excellent step coverage, and satisfies the second performance demanded for the DRAM capacitor film.

This BST film is generally formed by MOCVD by heating a substrate subjected to thin film formation, and supplying an oxidation gas such as oxygen ($O_2$) together with $Ba(thd)_2$, $Sr(thd)_2$, and $Ti(O-iPr)_2(thd)_2$ vapors to the heated substrate.

Note that $Ba(thd)_2$, $Sr(thd)_2$, and $Ti(O-iPr)_2(thd)_2$ are barium source, strontium source, and titanium source.

Formation of a BST film by MOCVD includes two methods, i.e., a premix method of mixing source gases and an oxidation gas in advance and supplying the gas mixture to a heated substrate, and a postmix method of individually supplying source gases and an oxidation gas to a heated substrate. Of the two supply methods, the premix method is more desirable because the source gases and oxidation gas can be supplied at a predetermined mixing ratio, a film can be formed even on a large-area substrate with a uniform thickness and composition, and the film composition can be easily controlled.

Since the premix method mixes an oxidation gas in advance, each source gas and the oxidation gas readily react with each other immediately before a source gas supply port to readily produce various intermediates. Since intermediates are readily produced, unwanted products are generated before the gas reaches the substrate. The unwanted products enter a film growing on the substrate to degrade the film quality.

To reduce oxygen defects in a BST film, suppress mixture of by-products in the film, and improve the film quality, the partial pressure of the oxidation gas on the substrate surface subjected to film formation is preferably set high. To increase the partial pressure of the oxidation gas on the substrate surface, the diameter of a gas supply port for supplying a source gas to the substrate is set small, or the oxygen flow rate is increased to increase the flow speed of gas supplied via the gas supply port so as to allow a larger amount of oxidation gas to reach the substrate surface.

When a larger amount of oxidation gas is supplied by decreasing the diameter of the gas supply port, the internal pressure increases immediately before the gas supply port. A gasifying unit for gasifying an organic metal compound is difficult to gasify the organic metal compound, and readily clogs.

Since unwanted products generated by a mixture of an oxidation gas and source gas readily coagulate at the end portion of the small-diameter gas supply port, the end portion of the gas supply port readily clogs with the unwanted products. Moreover, the film quality of a formed metal oxide film is poor owing to the above problem.

To the contrary, the postmix method does not mix an oxidation gas and source gas, and is free from the above-mentioned problem caused by unwanted products. However, the postmix method is difficult to form a film having a uniform film composition on a large-area substrate. This problem for a large-area substrate becomes serious particularly when a large amount of oxygen must be supplied for film formation. In addition, the postmix method of individually supplying an oxidation gas and source gas to a substrate is difficult to control the film composition. For example, when a BST film is to be formed, oxygen as an oxidation gas must be supplied at a flow rate of about 1 SLM. However, if such a large amount of oxidation gas is supplied, a BST film formed on an 8" substrate is nonuniform in film thickness and film composition.

In formation of a BST film by MOCVD, Ti is hardly contained in a film being formed, compared to Ba and Sr. The content of Ti in the formed film cannot reach a predetermined value, and a high-quality BST film is difficult to form. The phenomenon that Ti is hardly contained in a film being formed poses a serious problem particularly when a film is formed at a low temperature in order to reduce thermal stress on the underlayer.

SUMMARY OF THE INVENTION

It is, therefore, a principal object of the present invention to provide a formation method and apparatus for a metal oxide film excellent in uniformity and electrical characteristics.

According to an aspect of the present invention, there is provided a metal oxide film formation method comprising the steps of individually preparing a source gas mixture essentially consisting of organic compound gases containing at least three metals, and an oxidation gas, supplying the oxidation gas to a substrate set in a closed vessel at a predetermined pressure and then supplying the gas mixture while the substrate is heated, and forming a metal oxide film on the substrate.

According to another aspect of the present invention, there is provided a metal oxide film formation method comprising the steps of individually preparing a first source gas mixture essentially consisting of organic compound gases containing at least two metals, and a second source gas mixture obtained by mixing in advance an organic compound gas containing titanium and an oxidation gas, supplying the oxidation gas to a substrate set in a closed vessel at a predetermined pressure and then supplying the gas mixtures while the substrate is heated, and forming a metal oxide film on the substrate.

According to still another aspect of the present invention, there is provided a metal oxide film formation apparatus comprising a film formation chamber constituting a closed vessel, evacuation means for evacuating an interior of the film formation chamber to a predetermined vacuum degree, a substrate susceptor arranged in the film formation chamber to place a substrate on a surface of which a metal oxide film is to be formed, heating means for heating the substrate set on the substrate susceptor, first supply means for supplying a source gas mixture essentially consisting of organic compound gases containing at least three metals to the surface of the substrate set on the substrate susceptor, and second supply means for supplying an oxidation gas to the surface of the substrate set on the substrate susceptor.

DESCRIPTION OF THE PREFERRED EMBODIMENTS

Preferred embodiments of the present invention will be described below with reference to the accompanying drawings.

First Embodiment

The first embodiment of the present invention will be described.

Figure 1:
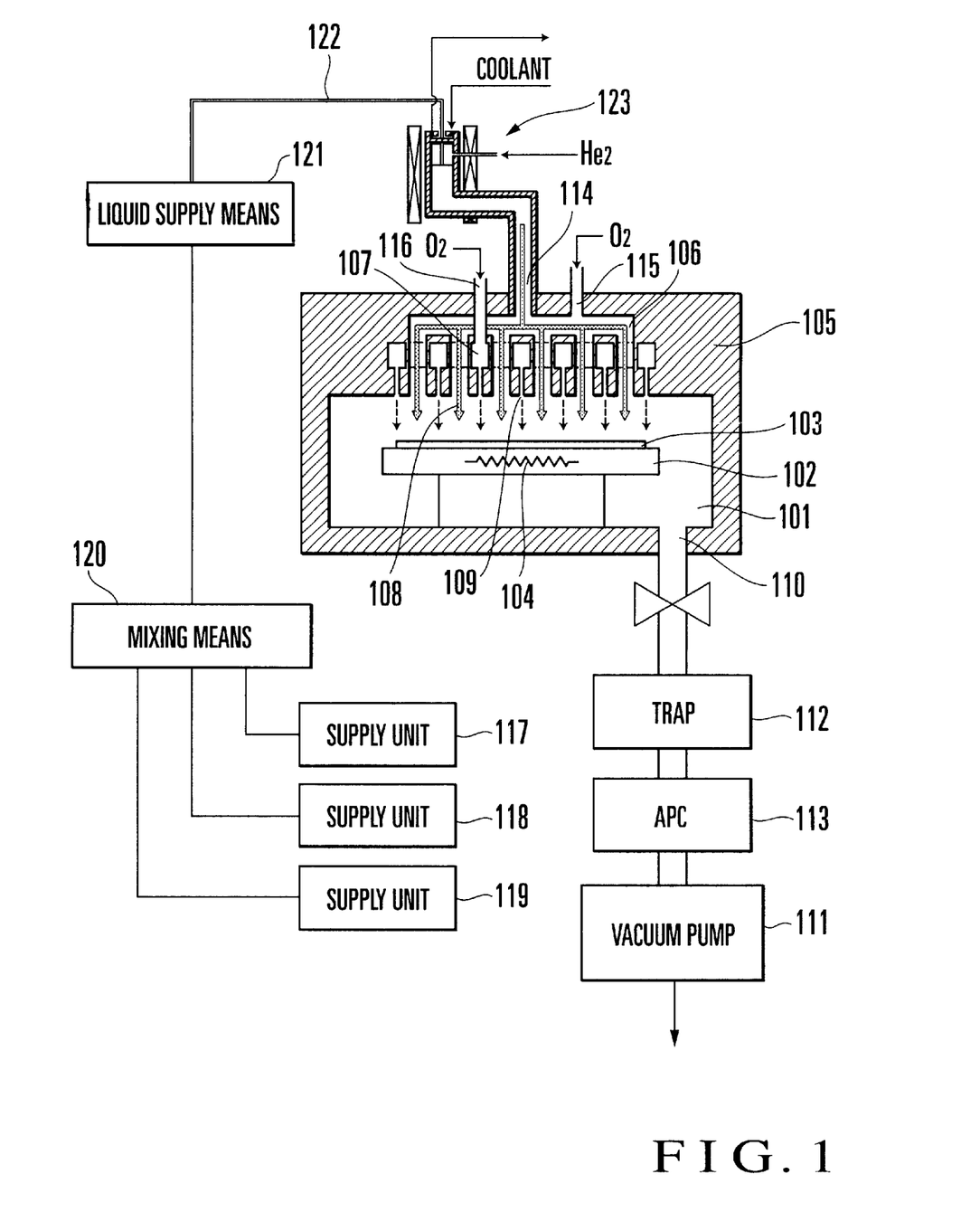
FIG. 1 is a view showing the basic structure of a metal oxide film formation apparatus in the first embodiment for explaining the present invention.

FIG. 1 shows an embodiment of a metal oxide film formation apparatus for explaining a metal oxide film formation method according to the present invention. This metal oxide film formation apparatus comprises a film formation chamber 101 which incorporates a substrate susceptor 102. This apparatus forms a film on a substrate 103 set on the substrate susceptor 102. The substrate susceptor 102 has a heating means 104 so as to heat the substrate 103 set on the substrate susceptor 102.

A shower head 105 is arranged at the upper portion of the film formation chamber 101. The shower head 105 includes a shower cubicle 106 for temporarily storing a source gas to increase the gas pressure, and a shower cubicle 107 for temporarily storing an oxidation gas made of oxygen and the like to increase the gas pressure. In the shower cubicle 106 of the shower head 105, predetermined gases including a source gas are mixed. The gas mixed in the shower cubicle 106 is discharged to the film formation chamber 101 via premix gas discharge ports 108. An oxidation gas introduced into the shower cubicle 107 is discharged to the film formation chamber 101 via oxidation gas discharge ports 109 whose diameter is as small as 0.5 to 1 mm. A larger amount of oxidation gas can be carried to the substrate 103.

The interior of the film formation chamber 101 is evacuated to a predetermined vacuum degree by a vacuum pump 111 via an exhaust port 110. A trap 112 and automatic chamber pressure control (APC) 113 are interposed between the exhaust port 110 and the vacuum pump 111.

The shower cubicle 106 receives a source gas via a source gas inlet portion 114, and an oxidation gas via a mixing oxidation gas inlet portion 115. The shower cubicle 107 receives an oxidation gas via an oxidation gas inlet portion 116. Either of the oxidation gas introduced via the inlet portion 115 and the oxidation gas introduced via the inlet portion 116 is one gas selected from the group consisting of oxygen gas ($O_2$), nitrogen dioxidation gas ($NO_2$), dinitrogen oxidation gas ($N_2O$), and ozone gas ($O_3$). These oxidation gases are used similarly in the following embodiments.

Figure 2:
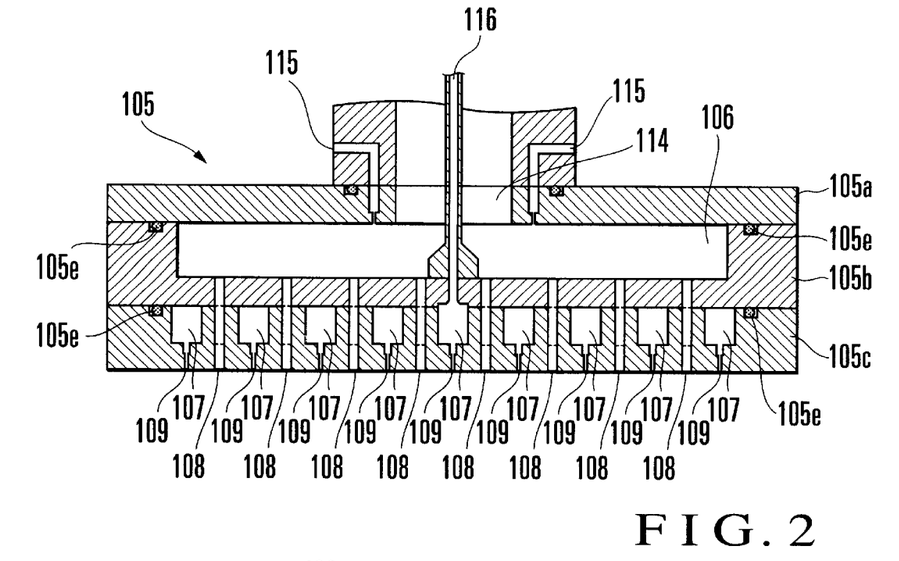
FIG. 2 is a sectional view showing an example of a shower head shown in FIG. 1.

The structure of the shower head 105 is explained in more detail. FIG. 2 shows an example of the shower head. The shower head 105 is constituted by three, upper plate 105a, middle plate 105b, and lower plate 105c. The shower cubicle 106 is formed in the middle plate 105b constituting the shower head 105. The shower cubicle 107 is formed in the lower plate 105c. The shower cubicle 106 formed in the middle plate 105b is covered with the upper plate 105a. The shower cubicle 107 formed in the lower plate 105c is covered with the middle plate 105b.

Each premix gas discharge port 108 of the shower head 105 communicates with the shower cubicle 106 via a communication hole 105d formed in the lower plate 105c. The communication hole 105d communicating with the shower cubicle 106 is isolated from the shower cubicle 107.

In the shower head 105, O-rings 105e made of Kalrez are interposed between the source gas inlet portion 114 and the upper plate 105a, between the upper and middle plates 105a and 105b, and between the middle and lower plates 105b and 105c in order to prevent leakage of gases from the shower cubicles 106 and 107. In the first embodiment, the O-ring 105e is made of Kalrez in order to resist corrosion and heat, but is not limited to this. When the shower head 105 is not used in a high-temperature environment, the O-ring 105e may be made of another corrosion-resistant elastomer such as Vitom.

The communication hole 105d is formed in the lower plate 105c in addition to the shower cubicle 107. In the presence of the communication hole 105d, an oxidation gas in the shower cubicle 107 may leak from the boundary between the lower and middle plates 105c and 105b to a source gas flowing through the communication hole 105d. To prevent leakage of the oxidation gas to the communication hole 105d, a heat-resistant shield such as an O-ring or polyimide sheet is interposed between the middle and lower plates 105b and 105c at the formation portion of the communication hole 105d. To prevent leakage of the oxidation gas to the communication hole 105d, an inner tube may be arranged from the shower cubicle 106 to the communication hole 105d and premix gas discharge port 108.

The metal oxide film formation apparatus shown in FIG. 1 comprises a Ba source supply unit 117 containing $Ba(thd)_2$ as a Ba film formation material, a Ti source supply unit 118 containing $Ti(O-iPr)_2(thd)_2$ as a Ti film formation material, and an Sr source supply unit 119 containing $Sr(thd)_2$ as an Sr film formation material. Liquid sources supplied from the Ba, Ti, and Sr source supply units 117, 118, and 119 are mixed by a mixing means 120. The liquid source mixture mixed by the mixing means 120 is carried by a liquid supply means 121 to a source gasifying means 123 via a supply tube 122. The liquid source mixture carried to the source gasifying means 123 via the supply tube 122 is gasified by the source gasifying means 123, and the source gas is introduced into the source gas inlet portion 114.

Figure 3:
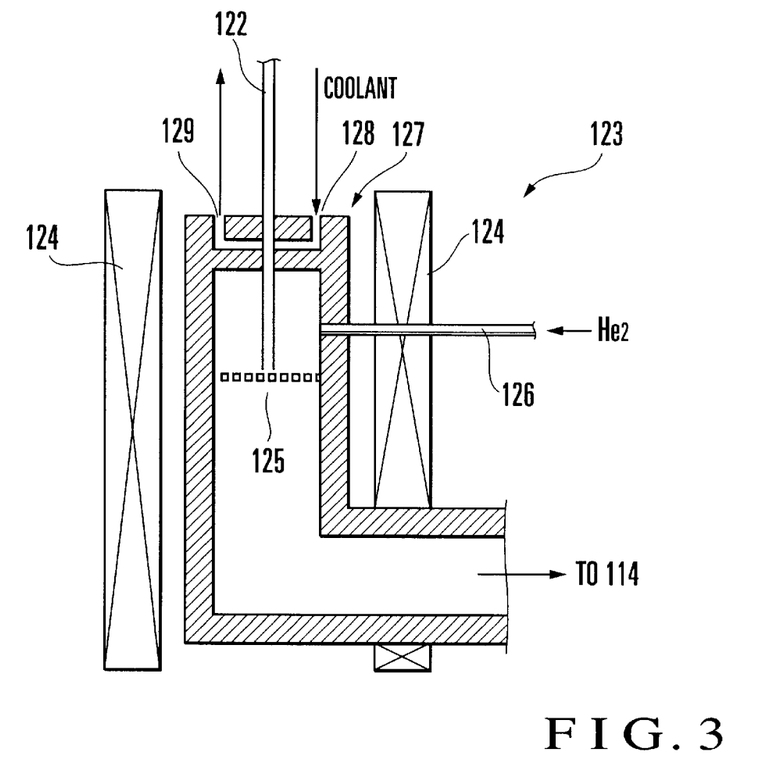
FIG. 3 is an enlarged sectional view showing a source gasifying means shown in FIG. 1.

As shown in FIG. 3, the source gasifying means 123 is entirely heated by a heater 124, and a mesh 125 incorporated in the source gasifying means 123 is also set in a high-temperature state. In this high-temperature state, the liquid source carried to the source gasifying means 123 is discharged from the distal end of the supply tube 122 extending into the source gasifying means 123, and contacts the heated mesh 125. As a result, the liquid source is heated by the mesh 125, and evaporates. The source gas gasified by the mesh 125 is carried to the source gas inlet portion 114 together with a carrier gas such as helium supplied from a carrier gas inlet portion 126.

A cooling means 127 is arranged at a portion of the source gasifying means 123 in contact with the supply tube 122 to prevent a liquid source carried via the supply tube 122 from being excessively heated. The cooling means 127 for cooling part of the supply tube 122 has a coolant inlet and outlet 128 and 129. A coolant such as dry air is introduced from the coolant inlet 128, and the coolant which has exchanged heat at the cooling means 127 is discharged from the coolant outlet 129.

A gas path from the source gasifying means 123 to the source gas inlet portion 114, the shower head 105, and the film formation chamber 101 are heated to, e.g., about 200 to 250° C., and controlled not to liquefy the internal gas.

In the first embodiment, a small amount of oxidation gas can be introduced from the mixing oxidation gas inlet portion 115 to the shower cubicle 106 of the shower head 105, as described above. With the structure capable of introducing a small amount of oxidation gas to the shower cubicle 106, this oxidation gas and a source gas introduced from the source gas inlet portion 114 are mixed into a premix gas in the shower cubicle 106, and the premix gas is supplied to the substrate 103 via the premix gas discharge ports 108. The premix gas supplied to the substrate 103 and a large amount of oxidation gas discharged via the oxidation gas discharge ports 109 are mixed on the substrate 103.

Mixing on the substrate 103 will be explained in more detail. The Ba source supply unit 117 supplies the Ba source at 0.025 ml/min; the Ti source supply unit 118, Ti source at 0.33 ml/min; and the Sr source supply unit 119, Sr source at 0.025 ml/min.

The Ba, Ti, and Sr sources supplied from the respective supply units are mixed by the mixing means 120, and the source mixture is carried by the liquid supply means 121 to the source gasifying means 123 via the supply tube 122. The source gasifying means 123 gasifies the source mixture carried via the supply tube 122 by heating it to 230° C. A carrier gas is added to the gasified source mixture at a flow rate of 200 sccm, and the resultant source gas mixture is supplied to the shower cubicle 106 via the source gas inlet portion 114.

An oxidation gas is supplied at a flow rate of 100 to 2,000 sccm from the mixing oxidation gas inlet portion 115 to the shower cubicle 106 which has received the source gas mixture. The source gas mixture and a small amount of oxidation gas are mixed into a premix gas in the shower cubicle 106.

On the other hand, an oxidation gas is introduced at a flow rate of 1,000 to 4,000 sccm from the oxidation gas inlet portion 116 to the shower cubicle 107. This oxidation gas is discharged to the film formation chamber 101 via the oxidation gas discharge ports 109. Each oxidation gas discharge port 109 for discharging an oxidation gas has a small diameter of 0.5 to 1 mm.

In the first embodiment, an oxidation gas is mixed in a source gas mixture in advance in the shower cubicle 106. Since the premix gas supplied from the shower cubicle 106 contains the oxidation gas in addition to the source gas mixture, intermediates which contribute to formation of a Ti film are generated to a certain degree. However, the premix gas contains only a small amount of oxidation gas, so generation of unwanted products is suppressed.

A large amount of oxidation gas necessary to form a BST film is introduced from the oxidation gas discharge ports 109 to the film formation chamber 101 via the shower cubicle 107 arranged separately from the shower cubicle 106, as described above. Since a large amount of oxidation gas is introduced by a so-called postmix method, the oxidation gas concentration on the surface of the substrate 103 can be increased.

In forming a metal oxide film on the substrate 103, a source gas mixture is supplied to the substrate 103 via the shower cubicle 106 while a large amount of oxidation gas is supplied to the substrate 103 via the shower cubicle 107. Then, film formation starts without waiting for any incubation time, and a high-quality film can be formed. To stop gas supply to the substrate 103, the source gas mixture is stopped while the oxidation gas is kept supplied. This allows forming a metal oxide film excellent in electrical characteristics, i.e., leakage characteristics.

As described above, according to the first embodiment, each source gas is supplied to the surface of the substrate 103 by the premix method of generating intermediates which contribute to formation of an Sr film, to a certain degree in advance, and a large amount of oxidation gas is supplied by the postmix method. If the substrate 103 is heated to 450° C. by the heating means 104, a high-quality BST film can be formed with a composition with which a desired permittivity can be obtained.

The first embodiment has exemplified formation of a BST film, but can be similarly applied to formation of a PZT film.

In forming a PZT film, the apparatus having the structure shown in FIGS. 1, 2, and 3 can be applied by using the Ba source supply unit 117 as a Pb source supply unit for Pb(DPM), the Ti source supply unit 118 as a Ti source supply unit for Ti(i-OC$_3$H$_7$)$_2$, and the Sr source supply unit 119 as a Zr source supply unit for Zr(DPM).

Second Embodiment

The second embodiment of the present invention will be described with reference to FIG. 4.

Figure 4:
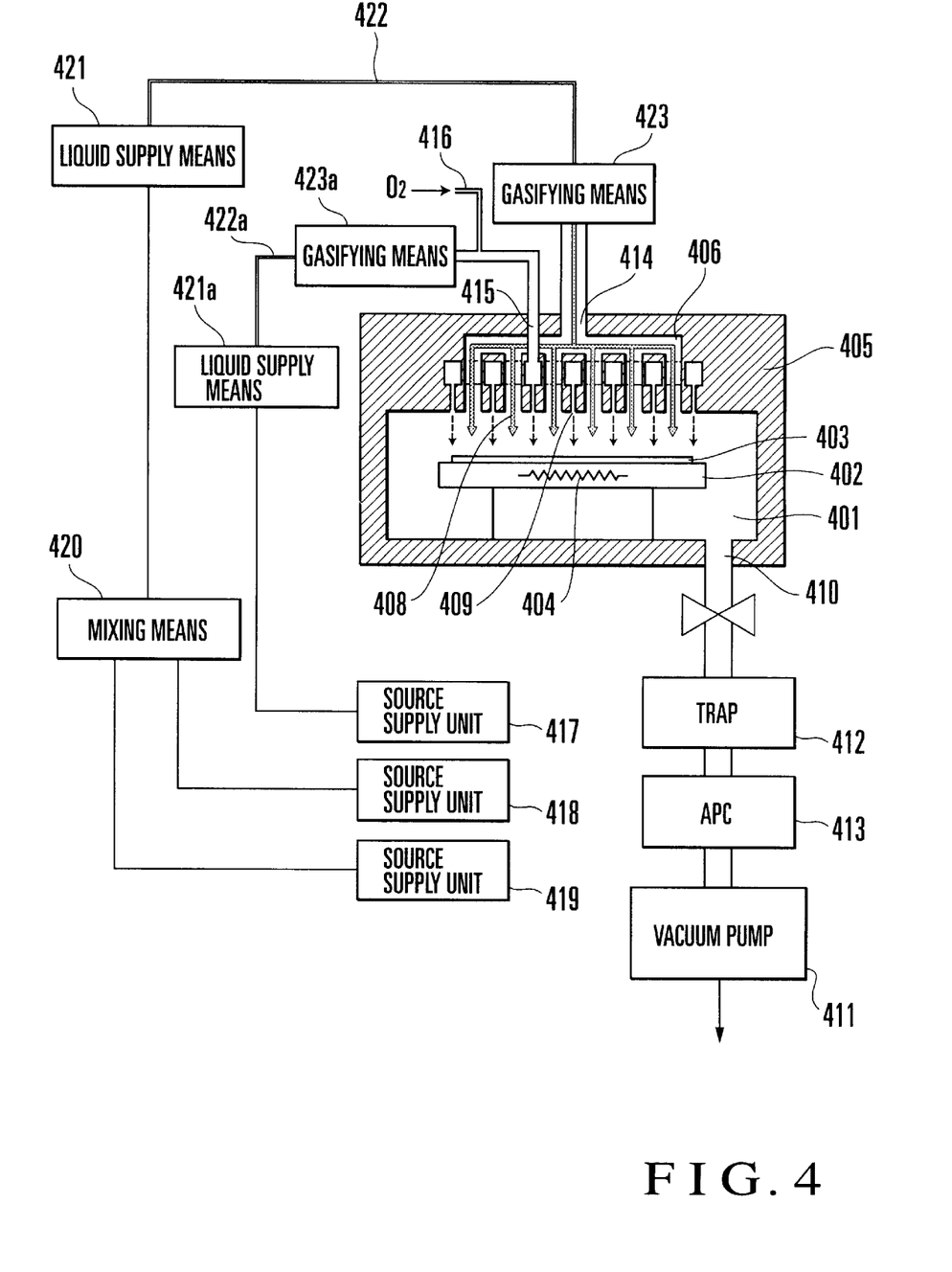
FIG. 4 is a view showing the basic structure of a metal oxide film formation apparatus in the second embodiment of the present invention.

FIG. 4 shows the basic structure of a metal oxide film formation apparatus in the second embodiment. This metal oxide film formation apparatus comprises a film formation chamber 401 which incorporates a substrate susceptor 402. A substrate 403 is set on the substrate susceptor 402, and subjected to film formation. The substrate susceptor 402 has a heating means 404 so as to heat the substrate 403 set on the substrate susceptor 402.

A shower head 405 is arranged at the upper portion of the film formation chamber 401, and includes two shower cubicles 406 and 407. Source gases mixed in the shower cubicle 406 of the shower head 405 are discharged via gas discharge ports 408 into the film formation chamber 401 evacuated to a predetermined vacuum degree. A predetermined source gas and an oxidation gas are introduced into the shower cubicle 407 of the shower head 405, and a gas mixture of the introduced source gas and oxidation gas is discharged into the film formation chamber 401 via oxidation gas discharge ports 409 whose diameter is as small as 0.5 to 1 mm. As a result, a larger amount of oxidation gas can be carried together with the predetermined source gas to the substrate 403 placed in the film formation chamber 401.

The interior of the film formation chamber 401 is evacuated by a vacuum pump 411 via an exhaust port 410. A trap 412 and automatic chamber pressure control (APC) 413 are interposed between the exhaust port 410 and the vacuum pump 411.

A predetermined gas is introduced into the shower cubicle 406 via a gas inlet portion 414, whereas a predetermined gas is introduced into the shower cubicle 407 via a gas inlet portion 415.

The metal oxide film formation apparatus according to the second embodiment also comprises a Ba source supply unit 418 containing Ba(thd)$_2$ as a Ba film formation material, a Ti source supply unit 417 containing Ti(O-iPr)$_2$(thd)$_2$ as a Ti film formation material, and an Sr source supply unit 419 containing Sr(thd)$_2$ as an Sr film formation material.

In the second embodiment, the Ba and Sr sources from the Ba and Sr source supply units 418 and 419 are mixed by a mixing means 420, and carried by a liquid supply means 421 to a gasifying means 423 via a supply tube 422. The Ti source from the Ti source supply unit 417 is singly carried by a liquid supply means 421a to a gasifying means 423a via a supply tube 422a. The source mixture carried via the supply tube 422 is gasified by the gasifying means 423, and introduced into the gas inlet portion 414. The Ti source carried via the supply tube 422a is gasified by the gasifying means 423a, and introduced into the gas inlet portion 415.

An oxidation gas inlet portion 416 is interposed midway along a path from the gasifying means 423a to the gas inlet portion 415. The oxidation gas inlet portion 416 supplies an oxidation gas to the gas inlet portion 415.

Gas paths from the gasifying means 423 and 423a to the gas inlet portions 414 and 416, the shower head 405, and the film formation chamber 401 are heated to, e.g., about 200 to 250° C., and controlled not to liquefy the internal gas.

In the second embodiment, a source gas as a mixture of Ba and Sr sources is introduced into the shower cubicle 406, and the source gas mixture introduced into the shower cubicle 406 is supplied to the substrate 403 via the gas discharge ports 408.

A gas mixture of Ti source gas and an oxidation gas is introduced into the shower cubicle 407, and the gas mixture introduced into the shower cubicle 407 is supplied to the substrate 403 via the oxidation gas discharge ports 409. The Sr and Ba sources contact the oxidation gas on the substrate 403 for the first time. To the contrary, the Ti source has already contacted the oxidation gas in the shower cubicle 407.

More specifically, the Ba source supply unit 418 supplies the Ba source at 0.025 ml/min; and the Sr source supply unit 419, Sr source at 0.025 ml/min. The supplied Ba and Sr sources are mixed by the mixing means 420, and the source mixture mixed by the mixing means 420 is carried by the liquid supply means 421 to the source gasifying means 423 via the supply tube 422. The source gasifying means 423 gasifies the source mixture carried by the liquid supply means 421 by heating it to 230° C. A carrier gas is added to the gasified source mixture at a flow rate of 200 sccm, and the resultant source gas mixture is supplied to the shower cubicle 406 via the source gas inlet portion 414.

Similarly, the Ti source supply unit 417 supplies the Ti source at 0.33 ml/min. This Ti source is singly carried by the liquid supply means 421a to the gasifying means 423a via the supply tube 422a. The gasifying means 423a gasifies the Ti source carried by the liquid supply means 421a by heating it to 230° C. An oxidation gas is added to the source gas obtained by the gasifying means 423a via the source gas inlet portion 416 at a flow rate of 1,000 to 4,000 sccm, and the resultant source gas mixture is supplied to the shower cubicle 407.

The shower cubicle 406 which receives the source gas mixture of barium and strontium discharges the supplied source gas mixture at a flow rate of about 200 sccm to the film formation chamber 401 controlled to a pressure of about 1 Torr via the gas discharge ports 408 each having a diameter of 1.5 to 2.0 mm.

The shower cubicle 407 mixes the supplied Ti source gas and oxidation gas, and supplies the gas mixture at a flow rate of about 2,000 sccm via the oxidation gas discharge ports 409 each having a diameter of 1.0 to 2.0 mm into the film formation chamber 401.

The source gas mixture of barium and strontium and the gas mixture of the Ti source gas and oxidation gas are supplied to the heated substrate 403 in the film formation chamber 401.

In the second embodiment, Ti source gas is mixed with an oxidation gas in advance separately from barium and strontium source gases. Since the oxidation gas exists in the Ti source gas in advance, the Ti source gas is supplied to the film formation chamber 401 while intermediates which contribute to Ti film formation of a BST film are generated to a certain degree. In other words, barium and strontium source gases are supplied while intermediates which contribute to Ti film formation of a BST film are generated to a certain degree on the substrate 403.

Since no Ba or Sr source gas is introduced into the shower cubicle 407, unwanted Ba or Sr products are hardly generated.

Also in the second embodiment, Ti source gas is supplied from the shower cubicle 407 while intermediates which contribute to formation of a Ti film are generated to a certain degree on the surface of the substrate 403. In addition, a necessary oxidation gas is sufficiently supplied. If the substrate 403 on the substrate susceptor 402 is heated to 450° C. by the heating means 404, a high-quality BST film can be formed on the substrate 403 with a composition with which a desired permittivity can be obtained.

The second embodiment has exemplified formation of a BST film, but can be similarly applied to formation of a PZT film.

In forming a PZT film, the apparatus having the structure shown in FIG. 4 can be applied by using the Ba source supply unit 418 as a Pb source supply unit for Pb(DPM), the Ti source supply unit 417 as a Ti source supply unit for Ti(i-OC$_3$H$_7$)$_2$, and the Sr source supply unit 419 as a Zr source supply unit for Zr(DPM).

Third Embodiment

Figure 5:
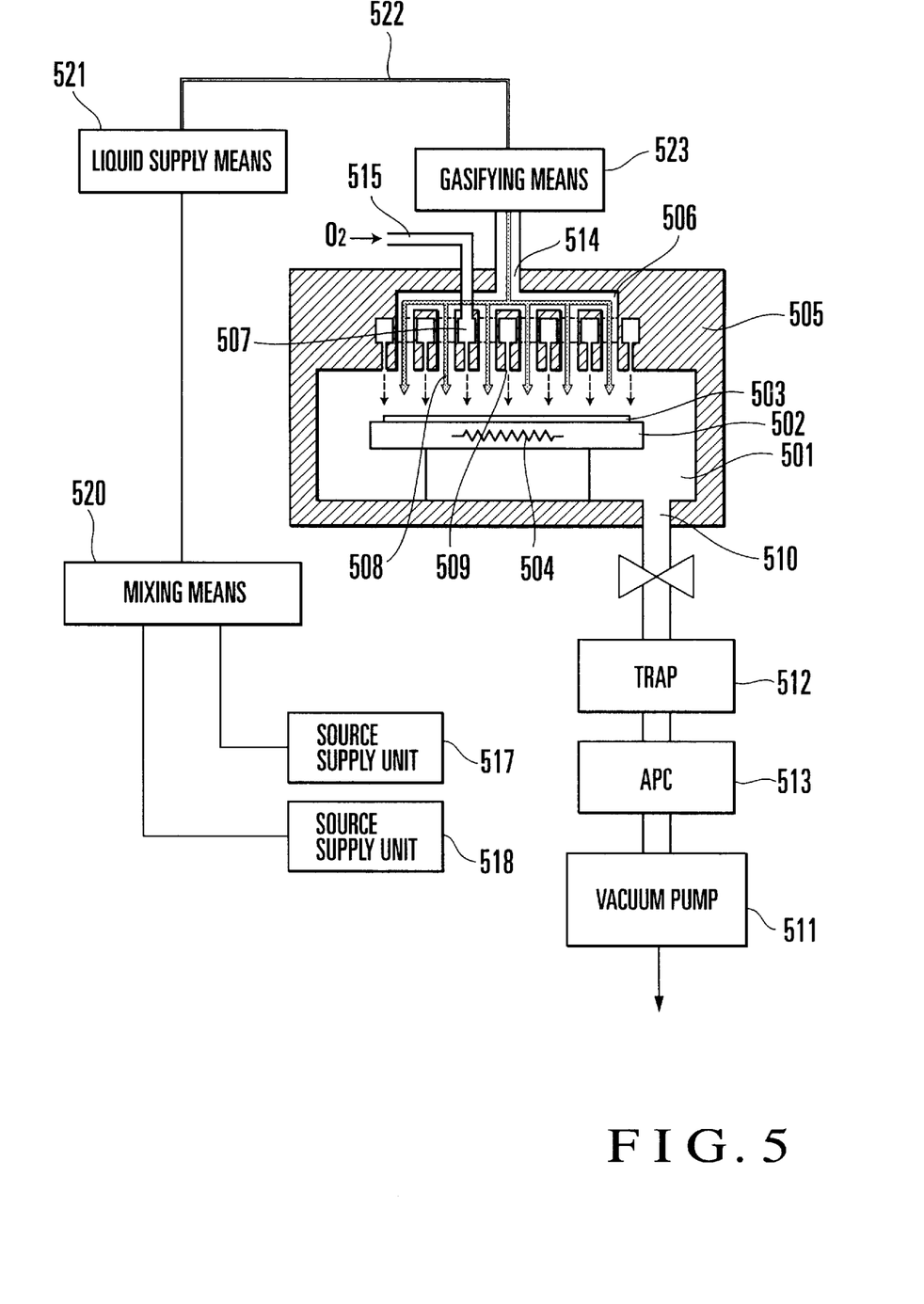
FIG. 5 is a view showing a metal oxide film formation apparatus in the third embodiment.

A BST film can also be formed as follows. The third embodiment adopts a metal oxide film formation apparatus as shown in FIG. 5. This metal oxide film formation apparatus also comprises a film formation chamber 501 which incorporates a substrate susceptor 502. A substrate 503 is set on the substrate susceptor 502. The substrate susceptor 502 has a heating means 504 so as to heat the substrate 503 set on the substrate susceptor 502.

A shower head 505 is arranged at the upper portion of the film formation chamber 501, and includes two shower cubicles 506 and 507. Source gases mixed in the shower cubicle 506 are discharged via gas discharge ports 508 into the film formation chamber 501 evacuated to a predetermined vacuum degree. An oxidation gas is introduced into the shower cubicle 507, and discharged into the film formation chamber 501 via oxidation gas discharge ports 509 whose diameter is as small as 0.5 to 1 mm. With this structure, a larger amount of oxidation gas can be carried to the substrate 503.

Similar to the first and second embodiments, the interior of the film formation chamber 501 is evacuated by a vacuum pump 511 via an exhaust port 510. A trap 512 and automatic chamber pressure control (APC) 513 are interposed between the exhaust port 510 and the vacuum pump 511.

A source gas is introduced into the shower cubicle 506 via a gas inlet portion 514, whereas an oxidation gas is introduced into the shower cubicle 507 via a gas inlet portion 515.

The third embodiment comprises a source supply unit 517 containing BaSr$_2$(thd)$_6$ and Ba$_2$Sr(thd)$_6$ as Ba and Sr film formation materials, and a source supply unit 518 containing Ti(thd)$_2$ (O-iPr)$_2$ as a Ti film formation material.

In this metal oxide film formation apparatus, a BaSr compound source is mixed with Ti source by a mixing means 520, and carried by a liquid supply means 521 to a gasifying means 523 via a supply tube 522. The liquid source mixture carried to the gasifying means 523 via the supply tube 522 is gasified by the gasifying means 523, and the gasified source mixture is introduced from the gas inlet portion 514 to the shower cubicle 506. An oxidation gas is supplied from the oxidation gas inlet portion 515, and singly introduced into the shower cubicle 507.

A gas path from the gasifying means 523 to the gas inlet portion 514, the shower head 505, and the film formation chamber 501 are heated to, e.g., about 200 to 250° C., and controlled not to liquefy the internal gas.

In the metal oxide film formation apparatus, a source gas mixture of a BaSr compound source and Ti source supplied to the shower cubicle 506 is supplied to the substrate 503 via the gas discharge ports 508. Further, an oxidation gas singly supplied to the shower cubicle 507 is singly supplied to the substrate 503 via the oxidation gas discharge ports 509.

As described above, in the metal oxide film formation apparatus, Sr in the form of a compound with Ba is supplied to the substrate 503, and the oxidation gas and source gas contact each other on the substrate 503 for the first time.

More specifically, the source supply unit 517 supplies the BaSr compound source at 0.05 ml/min; and the source supply unit 518, Ti source at 0.33 ml/min. The BaSr compound source from the source supply unit 517 and the Ti source from the source supply unit 518 are mixed by the mixing means 520, and the source mixture is carried by the liquid supply means 521 to the source gasifying means 523. The source gasifying means 523 gasifies the carried source mixture by heating it to 230 to 250° C. A carrier gas is added to the gasified source mixture at a flow rate of 200 sccm, and the resultant source gas mixture is supplied to the shower cubicle 506 via the source gas inlet portion 514.

An oxidation gas is introduced via the oxidation gas inlet portion 515 at a flow rate of 1,000 to 4,000 sccm, and supplied to the shower cubicle 507.

The source gas mixture of the BaSr compound source gas and Ti source gas supplied to the shower cubicle 506 is discharged at a flow rate of about 2,000 sccm to the film formation chamber 501 controlled to a pressure of about 1.0 Torr via the gas discharge ports 508 each having a diameter of 1.5 to 2.0 mm.

The oxidation gas supplied to the shower cubicle 507 is discharged at a flow rate of 1,000 to 4,000 sccm to the film formation chamber 501 via the oxidation gas discharge ports 509 each having a diameter of 0.5 to 1.0 mm.

The source gas mixture of the BaSr compound source gas and Ti source gas, and the oxidation gas are supplied to the heated substrate 503 in the film formation chamber 501.

Since the BaSr compound source is used, as described above, Sr bonding to Ba is supplied to the substrate 503. When a Ba film is formed, an Sr film is almost simultaneously formed.

By singly supplying an oxidation gas to the shower cubicle 507, a necessary oxidation gas is sufficiently supplied to the surface of the substrate 503. If the substrate 503 on the substrate susceptor 502 is heated to 450° C. by the heating means 504, a high-quality BST film can be formed on the substrate 503 with a composition with which a desired permittivity can be obtained.

The third embodiment has exemplified formation of a BST film, but can be similarly applied to formation of a PZT film.

In forming a PZT film, the apparatus having the structure shown in FIG. 5 can be applied by using the source supply unit 517 as a source supply unit for Pb(DPM)$_2$: (Bisdipivaloylmethanatolead: Pb(C$_{11}$H$_{19}$O$_2$)$_2$) and Zr(t-OC$_4$H$_9$)$_4$: tetratertialbutoxyzirconium, and the Ti source supply unit 518 as a Ti source supply unit for Ti(i-OC$_3$H$_7$)$_2$.

Fourth Embodiment

The fourth embodiment according to the present invention will be described.

Figure 6:
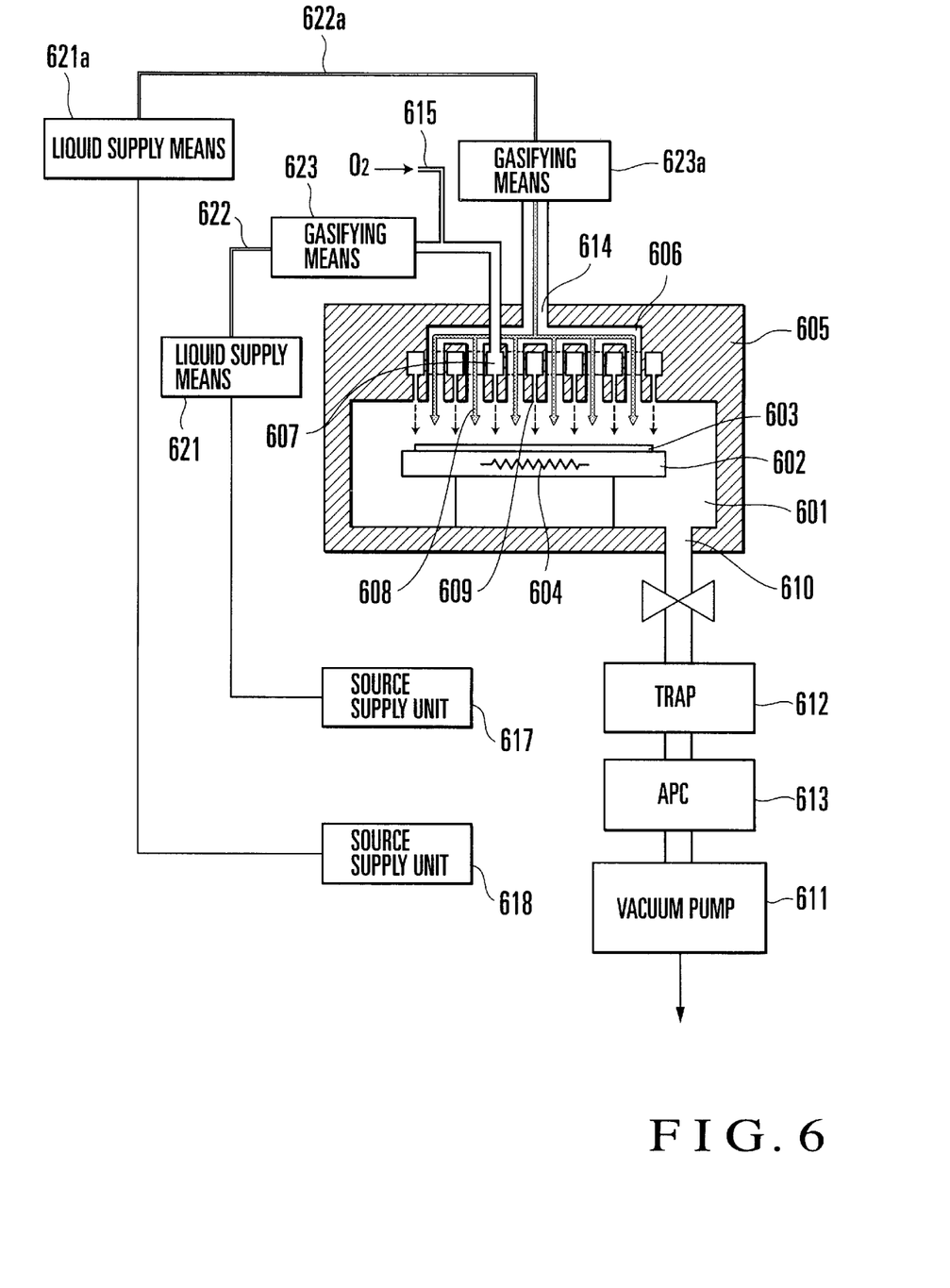
FIG. 6 is a view showing the structure of a metal oxide film formation apparatus in the fourth embodiment of the present invention.

FIG. 6 shows the basic structure of a metal oxide film formation apparatus in the fourth embodiment. This metal oxide film formation apparatus also comprises a film formation chamber 601 which incorporates a substrate susceptor 602. This metal oxide film formation apparatus forms a film on a substrate 603 set on the substrate susceptor 602. The substrate susceptor 602 has a heating means 604 so as to heat the substrate 603 set on the substrate susceptor 602.

A shower head 605 is arranged at the upper portion of the film formation chamber 601, and includes two shower cubicles 606 and 607. A source gas introduced into the shower cubicle 606 is discharged via gas discharge ports 608 into the film formation chamber 601 evacuated to a predetermined vacuum degree. An oxidation gas is introduced together with a source gas into the shower cubicle 607, and discharged into the film formation chamber 601 via gas discharge ports 609 whose diameter is as small as 1.0 to 2.0 mm. By using the gas discharge ports 609 each having a small diameter of 1.0 to 2.0 mm, a larger amount of oxidation gas can be carried to the substrate 603.

Similar to the first and second embodiments, the interior of the film formation chamber 601 is evacuated by a vacuum pump 611 via an exhaust port 610. A trap 612 and automatic chamber pressure control (APC) 613 are interposed between the exhaust port 610 and the vacuum pump 611.

A predetermined source gas is introduced into the shower cubicle 606 via a gas inlet portion 614, whereas a predetermined source gas is introduced into the shower cubicle 607 via a gas inlet portion 615.

The fourth embodiment comprises a source supply unit 617 containing BaSr$_2$(DPM)$_6$ and Ba$_2$Sr(DPM)$_6$ as Ba and Sr film formation materials, and a source supply unit 618 containing Ti(O-iPr)$_2$(DPM)$_2$ as a Ti film formation material. Note that the Ti film formation material may be TiO(DPM)$_2$.

In the fourth embodiment, a BaSr compound source from the source supply unit 617 is carried by a liquid supply means 621 to a gasifying means 623 via a supply tube 622. The liquid compound source carried via the supply tube 622 is gasified by the gasifying means 623. The gasified compound source is introduced into the shower cubicle 607 via the gas inlet portion 615 together with an oxidation gas introduced via an oxidation gas inlet portion 616.

On the other hand, Ti source from the source supply unit 618 is carried by a liquid supply means 621a to a gasifying means 623a via a supply tube 622a. The Ti source carried to the gasifying means 623a is gasified by the gasifying means 623a, and singly introduced into the shower cubicle 606 via the gas inlet portion 614.

Gas paths from the gasifying means 623 and 623a to the gas inlet portions 614 and 615, the shower head 605, and the film formation chamber 601 are heated to, e.g., about 200 to 250° C., and controlled not to liquefy the internal gas.

In the fourth embodiment, a gas mixture prepared by the BaSr compound source gas and oxidation gas supplied to the shower cubicle 607 is supplied to the substrate 603 via the gas discharge ports 609. The single Ti source gas supplied to the shower cubicle 606 is supplied to the substrate 603 via the gas discharge ports 608.

As described above, in the fourth embodiment, Sr which is in the form of a compound with Ba and is mixed with an oxidation gas in advance (premix) is supplied to the substrate 603. Ti source gas is singly supplied, and contacts another source gas and oxidation gas on the substrate 603 for the first time (postmix).

More specifically, the source supply unit 617 supplies the BaSr compound source at 0.05 ml/min. The source from the source supply unit 617 is carried by the liquid supply means 621 to the gasifying means 623. The gasifying means 623 gasifies the source carried by the liquid supply means 621 by heating it to 230 to 250° C. A carrier gas is added to the gasified gas at a flow rate of 200 sccm, and the resultant gas mixture is supplied to the shower cubicle 607 via the gas inlet portion 615. At this time, an oxidation gas introduced via the oxidation gas inlet portion 616 is also supplied to the shower cubicle 607.

The source supply unit 618 supplies the Ti source at 0.33 ml/min. The Ti source from the source supply unit 618 is carried by the liquid supply means 621a to the gasifying means 623a. The source gasifying means 623a gasifies the Ti source carried by the liquid supply means 621a by heating it to 230 to 250° C. A carrier gas is added to the obtained gas at a flow rate of 200 sccm, and the resultant source gas mixture is supplied to the shower cubicle 606 via the source gas inlet portion 614.

The gas mixture of the Ti source gas and oxidation gas introduced into the shower cubicle 606 is discharged at a flow rate of abut 2,000 sccm to the film formation chamber 601 controlled to a pressure of about 1.0 Torr via the gas discharge ports 608 each having a diameter of 1.0 to 2.0 mm.

The BaSr compound source gas supplied to the shower cubicle 607 is discharged at a flow rate of about 200 sccm to the film formation chamber 601 via the gas discharge ports 609 each having a diameter of 1.5 to 2.0 mm.

The gas mixture of the Ti source gas and oxidation gas, and BaSr compound source gas are supplied to the heated substrate 603 in the film formation chamber 601.

As described above, in the fourth embodiment, Ti source gas which readily produces unwanted intermediates when the Ti source gas contacts an oxidation gas is singly supplied to the film formation chamber, and contacts an oxidation gas and another source gas on the substrate for the first time. This suppresses generation of unwanted products in the shower head and at each discharge port.

In forming a BST film by CVD using the above-described organic metal compounds as raw materials, Ti must be supplied excessively, compared to Ba and Sr. According to the fourth embodiment, Ti source gas is supplied without being mixed with an oxidation gas in advance, so that a large amount of Ti source gas can be supplied.

If the substrate 603 on the substrate susceptor 602 is heated to 450° C. by the heating means 604 shown in FIG. 6, a high-quality BST film can be formed on the substrate 603 with a composition with which a desired permittivity can be obtained.

As described above, the metal oxide film formation method and apparatus according to the present invention cause a source gas mixture and oxidation gas to contact each other on a substrate for the first time, and can form a higher-quality metal oxide film than a conventional metal oxide film.

The fourth embodiment has exemplified formation of a BST film, but can be similarly applied to formation of a PZT film.

In forming a PZT film, the apparatus having the structure shown in FIG. 6 can be applied by using the source supply unit 617 as a source supply unit for a PbZr compound such as Pb(DPM)2: (Bisdipivaloylmethanatolead: Pb($C_{11}H_{19}O_2$)$_2$) and Zr(t-O$C_4H_9$)$_4$: tetratertialbutoxyzirconium, and the Ti source supply unit 618 as a Ti source supply unit for Ti(i-O$C_3H_7$)$_2$.

What is claimed is:

1. A metal oxide film formation apparatus comprising:
   a film formation chamber constituting a closed vessel;
   evacuation means for evacuating an interior of said film formation chamber to a vacuum degree;
   a substrate susceptor arranged in said film formation chamber to place a substrate on a surface of which a metal oxide film is to be formed;
   heating means for heating the substrate set on said substrate susceptor;
   first supply means for supplying a source gas mixture essentially consisting of organic compound gases containing at least three metals to the surface of the substrate set on said substrate susceptor; and
   second supply means for supplying an oxidation gas to the surface of the substrate set on said substrate susceptor,
   wherein said first and second supply means comprise a shower head arranged above said substrate susceptor, and said shower head comprises:
   a first shower cubicle for temporarily storing a gas supplied by said first supply means;
   a second shower cubicle for temporarily storing a gas supplied by said second supply means;
   a plurality of first gas discharge ports communicating with said first shower cubicle; and
   a plurality of second gas discharge ports communicating with said second shower cubicle.

2. An apparatus according to claim 1, wherein
   said shower head comprises an upper plate, a middle plate, and a lower plate,
   one of said first shower cubicle and said second shower cubicle is disposed between said upper plate and said middle plate, and
   the other of said first shower cubicle and said second shower cubicle is disposed between said middle plate and said lower plate.

3. An apparatus according to claim 1, further comprising leakage prevention means for preventing leakage of a gas in said first shower cubicle and a gas in said second shower cubicle.

4. An apparatus according to claim 2, further comprising leakage prevention means, arranged between the middle and lower plates, for preventing leakage of a gas in said first shower cubicle and a gas in said second shower cubicle.

5. An apparatus according to claim 4, wherein said leakage prevention means comprises a heat-resistant sheet.

6. A metal oxide film formation apparatus comprising:
   a film formation chamber constituting a closed vessel;
   evacuation means for evacuating an interior of said film formation chamber to a vacuum degree;
   a substrate susceptor arranged in said film formation chamber to place a substrate on a surface of which a metal oxide film is to be formed;
   heating means for heating the substrate set on said substrate susceptor;
   first supply means for supplying a source gas mixture essentially consisting of organic compound gases containing at least three metals to the surface of the substrate set on said substrate susceptor; and
   second supply means for supplying an oxidation gas to the surface of the substrate set on said substrate susceptor, wherein
   said first supply means comprises gasifying means for gasifying an organic compound liquid by heating, thereby generating the source gas mixture, and
   said gasifying means comprises a cooling mechanism at an inlet portion for the organic compound liquid.

7. An apparatus according to claim 2, wherein
   said first shower cubicle is disposed between said upper plate and said middle plate, and
   said second shower cubicle is disposed between said middle plate and said lower plate.

8. An apparatus according to claim 7, wherein said first gas discharge ports communicate with said first shower cubicle through communication holes passing through said lower plate and said middle plate.

9. A metal oxide film formation method comprising the steps of:

providing a film formation chamber constituting a closed vessel;

evacuating an interior of said film formation chamber to a vacuum degree;

placing a substrate on a surface of which a metal oxide film is to be formed on a substrate susceptor arranged in said film formation chamber;

heating the substrate set on said substrate susceptor;

providing a source gas mixture essentially consisting of organic compound gases containing at least three metals;

mixing an oxidation gas in the source gas mixture in advance and supplying the source gas mixture to the surface of the substrate set on said substrate susceptor through a first gas discharge port; and supplying the oxidation gas to the surface of the substrate set on said substrate susceptor through a second gas discharge port.

10. A method according to claim 9, further comprising the steps of:

supplying the source gas mixture and the oxidation gas to the substrate for a time; and stopping supply of the source gas mixture, and then stopping supply of the oxidation gas.

11. A method according to claim 9, wherein the metals include barium, strontium, and titanium.

12. A method according to claim 9, wherein the metals include lead, zirconium, and titanium.

13. A method according to claim 9, wherein the source gas mixture is prepared by mixing organic compound gases of the metals.

14. A method according to claim 9, wherein the source gas mixture is a mixture of an organic compound gas containing two metals as constituent elements and an organic titanium compound gas.

15. A method according to claim 9, wherein the oxidation gas is one gas selected from the group consisting of oxygen gas ($O_2$), nitrogen dioxidation gas ($NO_2$), dinitrogen oxidation gas ($N_2O$), and ozone gas ($O_3$).

16. A metal oxide film formation method comprising the steps of:

providing a film formation chamber constituting a closed vessel;

evacuating an interior of said film formation chamber to a vacuum degree;

placing a substrate on a surface of which a metal oxide film is to be formed on a substrate susceptor arranged in said film formation chamber;

providing a shower head arranged above said substrate susceptor, said shower head comprising a first shower cubicle, a second shower cubicle, a plurality of first gas discharge ports communicating with said first shower cubicle, and a plurality of second gas discharge ports communicating with said second shower cubicle;

heating the substrate set on said substrate susceptor;

temporarily storing a source gas mixture essentially consisting of organic compound gases containing at least three metals in the first shower cubicle;

supplying the source gas mixture to the surface of the substrate set on said substrate susceptor through the first gas discharge ports;

temporarily storing an oxidation gas in the second shower cubicle; and supplying the oxidation gas to the surface of the substrate set on said substrate susceptor through the second gas discharge ports.

17. A method according to claim 16, further comprising the steps of:

supplying the source gas mixture and the oxidation gas to the substrate for a time; and stopping supply of the source gas mixture, and then stopping supply of the oxidation gas.

18. A method according to claim 16, wherein the metals include barium, strontium, and titanium.

19. A method according to claim 16, wherein the metals include lead, zirconium, and titanium.

20. A method according to claim 16, wherein the source gas mixture is prepared by mixing organic compound gases of the metals.

21. A method according to claim 16, wherein the source gas mixture is a mixture of an organic compound gas containing two metals as constituent elements and an organic titanium compound gas.

22. A method according to claim 16, wherein the oxidation gas is one gas selected from the group consisting of oxygen gas ($O_2$), nitrogen dioxidation gas ($NO_2$), dinitrogen oxidation gas ($N_2O$), and ozone gas ($O_3$).

23. A metal oxide film formation method comprising the steps of:

individually preparing a first source gas mixture essentially consisting of organic compound gases containing at least two metals, and a second source gas mixture obtained by mixing in advance an organic compound gas containing titanium and an oxidation gas;

supplying the oxidation gas to a substrate set in a closed vessel at a pressure, and then supplying the first source gas mixture and the second source gas mixture from separate gas discharge ports while the substrate is heated; and forming a metal oxide film on the substrate.

24. A method according to claim 23, wherein the first source gas mixture includes a mixture of an organic barium compound gas and an organic strontium compound gas.

25. A method according to claim 23, wherein the first source gas mixture includes a mixture of an organic lead compound gas and an organic zirconium compound gas.

* * * * *